(12) United States Patent
Hsieh

(10) Patent No.: US 8,334,546 B2
(45) Date of Patent: Dec. 18, 2012

(54) LIGHT EMITTING DIODE

(75) Inventor: Chung-Chuan Hsieh, Taipei County (TW)

(73) Assignee: Everlight Electronics Co., Ltd., New Taipei (TW)

( * ) Notice: Subject to any disclaimer, the term of this patent is extended or adjusted under 35 U.S.C. 154(b) by 274 days.

(21) Appl. No.: 12/777,930

(22) Filed: May 11, 2010

(65) Prior Publication Data
US 2011/0079808 A1    Apr. 7, 2011

(30) Foreign Application Priority Data
Oct. 1, 2009  (TW) ................................ 98133348 A

(51) Int. Cl.
*H01L 33/00*  (2010.01)
(52) U.S. Cl. .................... 257/98; 257/99; 257/E33.057; 257/E33.058
(58) Field of Classification Search ........... 257/E33.057, 257/E33.058
See application file for complete search history.

(56) References Cited

U.S. PATENT DOCUMENTS
2006/0027829 A1 *  2/2006  Wang et al. ..................... 257/99

FOREIGN PATENT DOCUMENTS
TW          560697        11/2003

* cited by examiner

*Primary Examiner* — Daniel Whalen

(57) ABSTRACT

A light emitting diode is provided, including an LED chip, a reflector, a lens, a circuit plate, a circuit substrate and an electrical conductivity device. The LED chip is disposed in the reflector and the lens is disposed on the reflector, covering the reflector and the LED chip. The LED chip is electrically connected to the circuit plate. The circuit plate further includes a first through hole therein and the circuit substrate further includes a second through hole therein. The electrical conductivity device passes through the first through hole and the second through hole so that the circuit plate is electrically connect to the circuit substrate. The reflector is installed between the circuit plate and the circuit substrate. The first through hole and the second through hole are not connected to the reflector.

12 Claims, 4 Drawing Sheets

LIGHT EMITTING DIODE

CROSS REFERENCE TO RELATED APPLICATIONS

This Application claims priority of Taiwan Patent Application No. 098133348, filed on Oct. 1, 2009, the entirety of which is incorporated by reference herein.

BACKGROUND OF THE INVENTION

1. Field of the Invention

The present invention relates to a light emitting diode, and more particularly, to a packaging structure of a light emitting diode.

2. Description of the Related Art

The different type of light emitting diode packages comprises a lamp type, a PCB type and a PLCC type. FIG. 1 is a schematic view of a conventional lamp type LED. Referring to FIG. 1, a lamp type LED 10 comprises a lens 11, two holders 12a, 12b, an LED chip 13 and a wire 14. The holder 12a comprises a reflecting portion 121 formed by stamping. The LED chip 13 is disposed in the reflector 121 so that light from the LED chip 13 may completely reflect upward. The LED chip 13 is directly and electrically connected to the holder 12a. The LED chip 13 is electrically connected to the holder 12b by the wire 14. The lens 11 covers whole LED chip 13. Because the reflecting portion 121 of the lamp type LED 10 is formed by stamping, the surface of the reflecting portion 121 is smooth for efficient reflection. However, the lamp type LED 10 does not have an independent heat-dissipating area, and the heat-dissipating area is not directly connected to the outside of the LED 10. Thus, heat-dissipating efficiency for the lamp type LED 10 is not sufficiently efficient. Also during the DIP process, the holders 12a, 12b are bent for connection to a circuit board (not shown). Thus, the holders 12a, 12b, may weaken, be damaged or break at the bent areas. Moreover, a stamping gap and a mold gap are required for the lamp type LED 10. Thus, the lamp type LED 10 is hindered from being densely designed.

FIG. 2 is a schematic view of a conventional PCB type LED. Referring to FIG. 2, the PCB type LED 20 comprises a lens 21, two holders 22a, 22b, an LED chip 23, a wire 24 and a circuit board 25. The LED chip 23 is disposed on the holder 22a and electrically connected to the holder 22b via the wire 24. Thus, because the PCB type LED 20 is fabricated on the circuit board 25, the PCB type LED 20 may be densely designed. Moreover, since a pin of the PCB type LED 20 is formed by cutting, weakening, damage or breakage of a bent holder is prevented. However, the reflector of the PCB type LED 20 is not directly formed on the holders 22a, 22b via stamping but formed via other processes. Thus, the PCB type LED 20 does not provide the reflector with a smooth surface, decreasing reflection efficiency. Moreover, the PCB type LED 20 does not have an independent heat-dissipating area, and the heat-dissipating area is not directly connected to the outside of the LED 20. Thus, heat-dissipating efficiency for the PCB type LED 20 is decreased.

FIG. 3 is a schematic view of a conventional PLCC type LED. Referring to FIG. 3, the PCB type LED 30 comprises a lens 31, two holders 32a, 32b, an LED chip 33, a wire 34, a circuit board 35, and a reflector 36. The LED chip 33 is disposed on the holder 32a, and electrically connected to the holder 32b by the wire 34. The PCB type LED 30 uses the plastic reflector and has an independent heat-dissipating area directly connected to the outside of the LED 30. A pin of the PCB type LED 30 is bent and then packaged. Thus, weakening, damage or breakage of a bent holder is prevented. However, the PCB type LED 30 is packaged by adhesive. Thus, the PCB type LED 30 is hindered from being densely designed. Moreover, the structure of the pin and difficult injection process thereof??, hinders further miniaturization of the PCB type LED 30.

Meanwhile, referring to Taiwan Patent No. 560697 "SMD type LED structure", the conventional LED provides a reflector, directly installed on a circuit board. However, the LED chip is installed on the reflector. Thus, heat from the LED is directly transmitted to the reflector and then to the circuit board, which may cause weakening, damage or breakage of the circuit board. Also, no independent heat-dissipating area is provided.

BRIEF SUMMARY OF THE INVENTION

The present invention provides a light emitting diode comprising an LED chip, a reflector, a lens, a circuit plate, a circuit substrate and an electrical conductivity device. The LED chip is disposed in the reflector and the lens disposed on the reflector covers the reflector and the LED chip. The LED chip is electrically connected to the circuit plate. The circuit plate further includes a first through hole therein and the circuit substrate further includes a second through hole therein. The electrical conductivity device passes through the first through hole and the second through hole to make the circuit plate electrically connect to the circuit substrate. The reflector is installed between the circuit plate and the circuit substrate. The first through hole and the second through hole are not connected to the reflector.

Note that the reflector is made of metal material.

Note that the reflector comprises a body and a flange, and the flange extends from the edge of the body to the outside of the body.

Note that the light emitted by the JED chip is reflected by the body, and light is radiated from the lens.

Note that the circuit substrate further comprises an accommodating portion, and the reflector is disposed in the accommodating portion and is fixed by the flange.

Note that the flange is ring shaped.

Note that the light emitting diode further comprises a first isolating layer disposed on a plane on which the flange is disposed.

Note that the first isolating layer comprises an opening, and the flange of the reflector is disposed adjacent to the opening.

Note that the first isolating layer comprises a third through hole that corresponds to the first through hole and the second through hole.

Note that the light emitting diode further comprises a second isolating layer disposed between the first isolating layer and the circuit substrate.

Note that the second isolating layer comprises a fourth through hole that corresponds to the first through hole and the second through hole.

Note that the lens is hemisphere shaped.

Note that the circuit substrate further comprises a lower surface for circuit design thereon.

Note that the circuit plate further comprises an upper surface for circuit design thereon.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
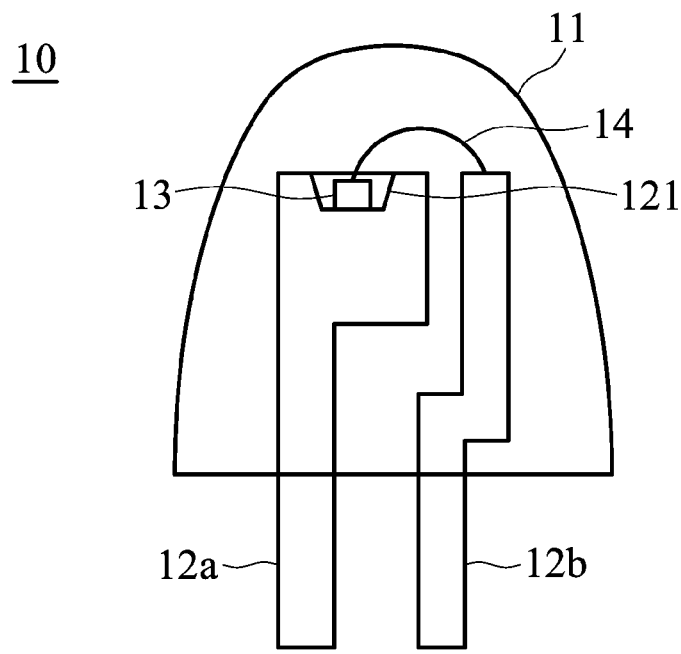
FIG. 1 is a schematic view of a conventional lamp type LED.
Figure 2:
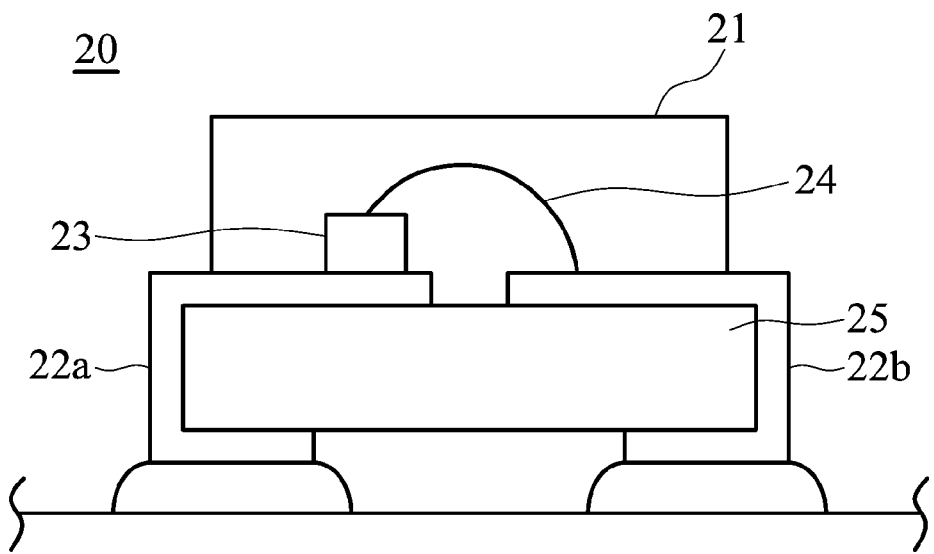
FIG. 2 is a schematic view of a conventional PCB type LED.
Figure 3:
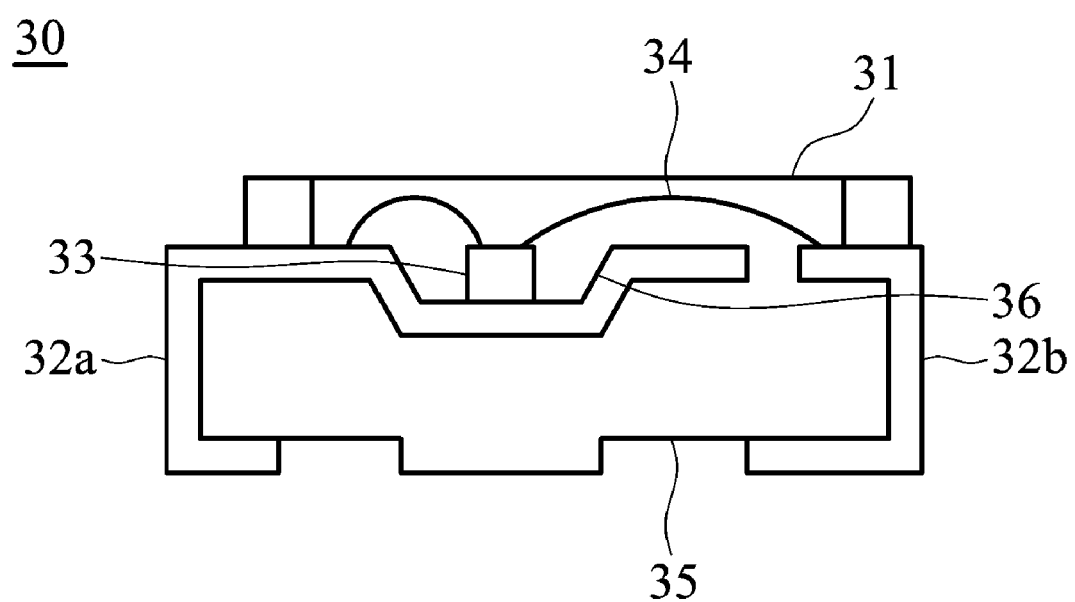
FIG. 3 is a schematic view of a conventional PLCC type LED.
Figure 4:
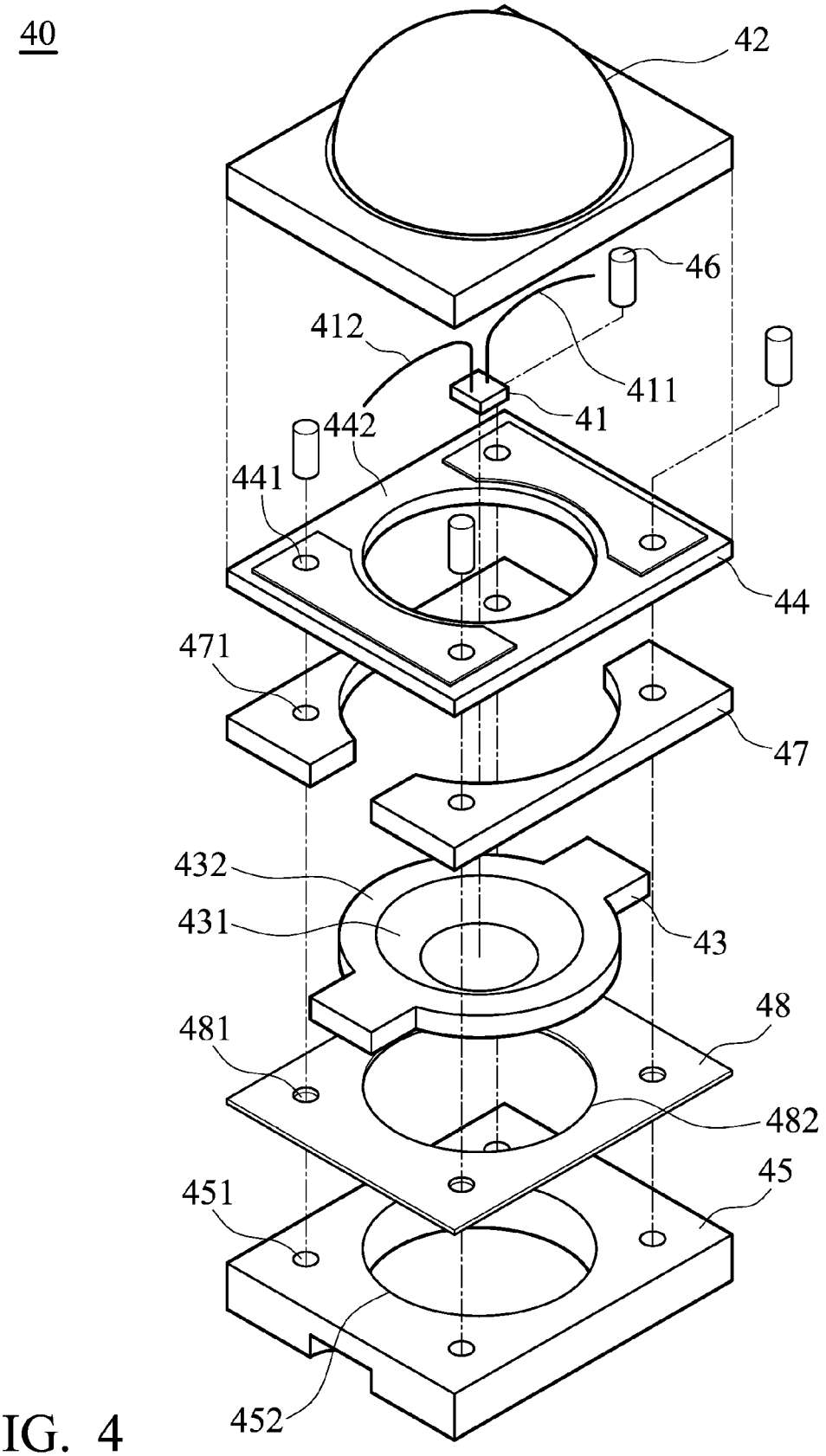
FIG. 4 is an exploded view of an LED of the invention.
Figure 5:
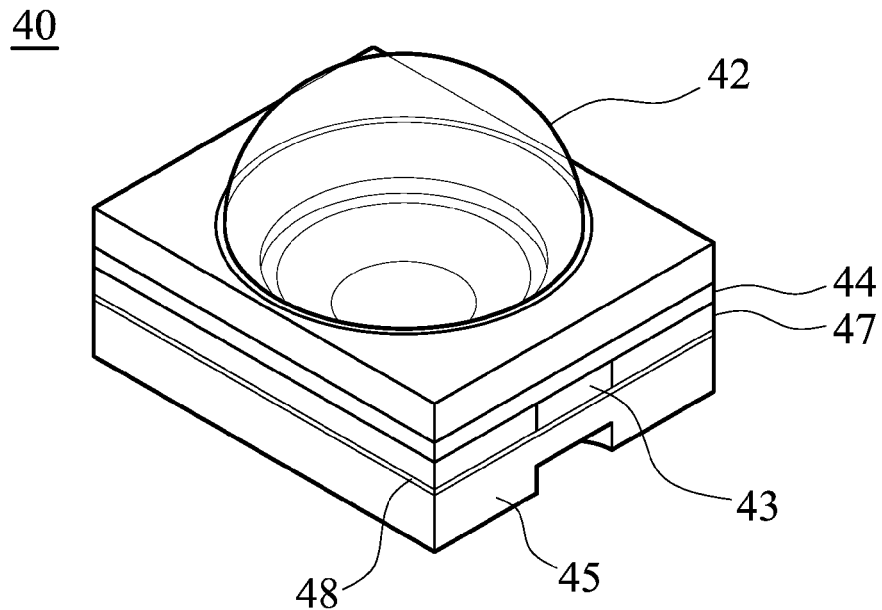
FIG. 5 is a schematic view showing a packaged LED of the invention.
Figure 6:
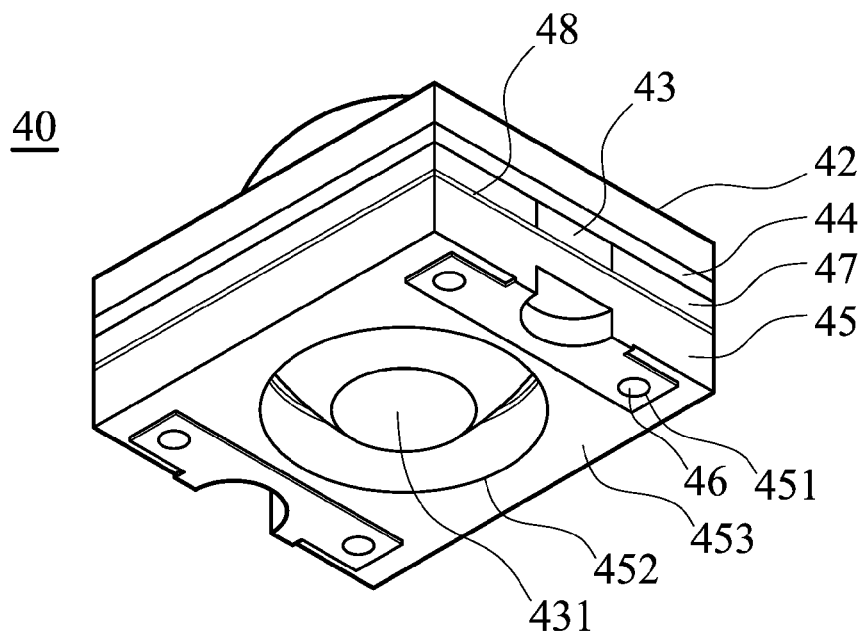
FIG. 6 is a schematic view of an LED of the invention at another view angle.

FIG. 4 is an exploded view of an LED of the invention. FIG. 5 is a schematic view showing a packaged LED of the invention. FIG. 6 is a schematic view of an LED of the invention at another view angle.

Referring to FIGS. 4-6, the LED 40 comprises an LED chip 41, a lens 42, a reflector 43, a circuit plate 44, a circuit substrate 45 and an electrical conductivity device (a wire 46). The LED chip 41 comprises two lead wires 411 and 412. The lead wires 411 and 412 are electrically connected to the LED chip 41. The lens 42 covers the LED chip 41 and the reflector 43 to change a path of light from the LED chip 41. The circuit plate 44 comprises a first through hole 441. The lead wires 411 and 412 are electrically connected to the circuit plate 44. The circuit substrate 45 comprises a second through hole 451. The wire 46 is disposed in the first through hole 441 and the second through hole 451 so that the circuit plate 44 electrically connects to the circuit substrate 45. The reflector 43 is disposed between the circuit plate 44 and the circuit substrate 45. The first through hole 441 and the second through hole 451 are not connected to the reflector 43 to ensure an independent heat-dissipating area.

The circuit substrate 45 further comprises an accommodating portion 452. The reflector 43 is disposed in the accommodating portion 452. The reflector 43 comprises a body 431 and a flange 432. The body 431 contains the LED chip 41. The flange 432 extends from the edge of the body 431 to the outside of the body 431. The flange 432 is ring shaped. The diameter of the flange 432 is greater than that of the accommodating portion 452. The reflector 43 is fixed on the circuit substrate 45 by the flange 432.

The LED 40 comprises a first isolating layer 47 and a second isolating layer 48. In this embodiment, the number of the first isolating layers 47 is two. The first isolating layer 47 is arched and disposed on a plane where the flange 432 is disposed. The first isolating layer 47 covers the flange 432 from the side thereof. The second isolating layer 48 is disposed between the first isolating layer 47 and the circuit substrate 45. The second isolating layer 48 comprises an accommodating portion 482 corresponding to the accommodating portion 452 of the circuit substrate 45. The body 431 of the reflector 43 passes through the accommodating portions 452 and 482 and then is engaged on the second isolating layer 48 and the circuit substrate 45 via the flange 432.

The first isolating layer 47 comprises a third through hole 471. The third through hole 471 corresponds to the first through hole 441 and the second through hole 451. The second isolating layer 48 comprises a fourth through hole 481. The fourth through hole 481 corresponds to the first through hole 441 and the second through hole 451. When the wire 46 connects to the circuit plate 44 and the circuit substrate 45, the wire 46 also passes through the third through hole 471 and the fourth through hole 481.

Note that the reflector 43 is made of metal material. The first isolating layer 47 and the second isolating layer 48 are made of isolation material. The lens 42 is hemisphere shaped and covers the reflector 43 and the LED chip 41. Referring to FIG. 6, the circuit substrate 45 further comprises a lower surface 453. In this embodiment, the lower surface 453 is used for circuit design thereon. Shown in FIG. 4, the circuit plate 44 further comprises an upper surface 442. In this embodiment, the upper surface 442 is used for circuit design thereon. The reflector 43 may serve as a heat-dissipating area. If so, the reflector 43 is independent from the circuit substrate 45.

Referring to FIGS. 4 and 5, the LED chip 41 is installed in the body 431 of the reflector 43. The reflector 43 is manufactured by stamping, thus, the reflector 43 has a smooth surface. Light from the LED chip 41 is reflected upward via the reflector 43 to increase radiation efficiency. Because the LED chip 41 is disposed on the reflector 43, heat generated by the LED chip 41 is transmitted to the reflector 43. The second isolating layer 48 disposed under the reflector 43 and is made of an isolation material. The side of the reflector 43 is covered by the first isolating layer 47 made of an isolation material. The circuit is disposed on the upper surface 442 of the circuit plate 44. Thus, the reflector 43 does not directly contact with the upper surface 442 of the circuit plate 44. Therefore, heat from the LED chip 41 does not affect the circuit plate 44. The heat-dissipating area of the reflector 43 is independent from the circuit substrate 45. Moreover, the body 431 of the reflector 43 passes through the accommodating portions 452 to be exposed to the outside of the LED 40, to increase heat-dissipating efficiency. The structure of the LED 40 of the invention is directly fabricated on the circuit substrate 45. Thus, weakening, damage or breakage of a bent holder is prevented.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode, comprising:
   an LED chip;
   a reflector comprising a body and a flange extending from the edge of the body to the outside of the body, wherein the LED chip is disposed in the reflector;
   a lens, covering the reflector and the LED chip;
   a circuit plate, comprising a first through hole, wherein the LED chip is electrically connected to the circuit plate;
   a circuit substrate, supporting the reflector and comprising a second through hole; and
   an electrical conductivity device, passing through the first through hole and the second through hole to electrically connect the circuit plate to the circuit substrate,
   wherein the reflector is disposed between the circuit plate and the circuit substrate to separate the circuit plate from the circuit substrate,
   wherein the circuit substrate further comprises an accommodating portion, and the reflector is disposed in the accommodating portion and is fixed by the flange.

2. The light emitting diode as claimed in claim 1, wherein the reflector is made of metal material.

3. The light emitting diode as claimed in claim 1, wherein light emitted by the LED chip is reflected by the body, and light is radiated from the lens.

4. The light emitting diode as claimed in claim 1, wherein the flange is ring shaped.

5. The light emitting diode as claimed in claim 1, further comprising a first isolating layer disposed on a plane on which the flange is disposed.

6. The light emitting diode as claimed in claim 5, wherein the first isolating layer comprises an opening, and the flange of the reflector is disposed adjacent to the opening.

7. The light emitting diode as claimed in claim 5, wherein the first isolating layer comprises a third through hole that corresponds to the first through hole and the second through hole.

8. The light emitting diode as claimed in claim 5, further comprising a second isolating layer disposed between the first isolating layer and the circuit substrate.

9. The light emitting diode as claimed in claim 8, wherein the second isolating layer comprises a fourth through hole that corresponds to the first through hole and the second through hole.

10. The light emitting diode as claimed in claim 1, wherein the lens is hemisphere shaped.

11. The light emitting diode as claimed in claim 1, wherein the circuit substrate further comprises a lower surface for circuit design thereon.

12. The light emitting diode as claimed in claim 1, wherein the circuit plate further comprises an upper surface for circuit design thereon.

* * * * *